United States Patent
Sun et al.

(10) Patent No.: US 11,084,906 B2
(45) Date of Patent: Aug. 10, 2021

(54) THERMALLY STABLE, LOW BIREFRINGENT COPOLYIMIDE FILMS

(75) Inventors: Limin Sun, Copley, OH (US); Dong Zhang, Uniontown, OH (US); Jiaokai Jing, Uniontown, OH (US); Frank W. Harris, Boca Raton, FL (US)

(73) Assignee: Akron Polymer Systems, Inc., Akron, OH (US)

(*) Notice: Subject to any disclaimer, the term of this patent is extended or adjusted under 35 U.S.C. 154(b) by 1285 days.

(21) Appl. No.: 13/588,414

(22) Filed: Aug. 17, 2012

(65) Prior Publication Data

US 2013/0216803 A1 Aug. 22, 2013

Related U.S. Application Data

(60) Provisional application No. 61/525,237, filed on Aug. 19, 2011.

(51) Int. Cl.
*C08L 79/08* (2006.01)
*C08G 73/10* (2006.01)
*B32B 27/28* (2006.01)
*C08J 5/18* (2006.01)
*C08J 5/04* (2006.01)
*B32B 17/10* (2006.01)

(52) U.S. Cl.
CPC ..... *C08G 73/1078* (2013.01); *C08G 73/1042* (2013.01); *C08J 5/043* (2013.01); *C08J 5/18* (2013.01); *C08L 79/08* (2013.01); *B32B 17/10* (2013.01); *B32B 27/281* (2013.01); *C08J 2379/08* (2013.01); *Y10T 428/31721* (2015.04)

(58) Field of Classification Search
CPC .......... C08G 69/48; C08G 73/1078; C08G 73/1042; C08J 5/18; C08J 5/043; C08J 2379/08; B32B 17/1055; B32B 27/281; B32B 17/10; Y10T 428/31721; Y10T 428/31623; Y10T 428/24975; C08K 7/14; C08L 63/00; C08L 79/08; H01L 31/03926; H01L 31/0392; Y02E 10/50; G02F 1/133305; H05K 1/0393
See application file for complete search history.

(56) References Cited

U.S. PATENT DOCUMENTS

| | | |
|---|---|---|
| 3,386,965 A | 6/1968 | Huffman |
| 4,461,886 A | 7/1984 | Rogers et al. |
| 5,039,785 A | 8/1991 | Irwin |
| 5,160,619 A | 11/1992 | Yamaguchi et al. |
| 5,177,149 A | 1/1993 | Angeli et al. |
| 5,189,538 A | 2/1993 | Arakawa |
| 5,290,887 A | 3/1994 | Hefner et al. |
| 5,387,657 A | 2/1995 | Hefner et al. |
| 5,396,355 A | 3/1995 | Wada et al. |
| 5,427,712 A | 6/1995 | Nakamura et al. |
| 5,529,818 A | 6/1996 | Tsuda et al. |
| 5,532,322 A | 7/1996 | Kadono et al. |
| 5,580,950 A | 12/1996 | Harris et al. |
| 5,677,390 A | 10/1997 | Dadgar et al. |
| 5,698,676 A | 12/1997 | Dhaon |
| 5,985,942 A | 11/1999 | Steck et al. |
| 6,074,709 A | 6/2000 | Ezzell et al. |
| 6,115,095 A | 9/2000 | Suzuki et al. |
| 6,175,400 B1 | 1/2001 | Duncan et al. |
| 6,214,923 B1 * | 4/2001 | Goto ............... C08L 79/08 428/473.5 |
| 6,627,377 B1 | 9/2003 | Itatani et al. |
| 6,881,454 B2 | 4/2005 | Taguchi |
| 7,037,443 B2 | 5/2006 | Shuto et al. |
| 7,135,211 B2 | 11/2006 | Shuto et al. |
| 7,227,602 B2 | 6/2007 | Jeon et al. |
| 7,236,221 B2 | 6/2007 | Ishikawa et al. |
| 2002/0041352 A1 | 4/2002 | Kuzuhara et al. |
| 2004/0051831 A1 | 3/2004 | Su Yu et al. |
| 2005/0057714 A1 | 3/2005 | Jeon et al. |

(Continued)

FOREIGN PATENT DOCUMENTS

| | | |
|---|---|---|
| EP | 1 506 991 | 2/2005 |
| JP | 04 215 602 | 8/1992 |

(Continued)

OTHER PUBLICATIONS

Zhang, D., et al., "Mesogen-Jacketed Liquid Crystal Polymers with Mesogens of Aromatic Amide Structure" Polymers for Advanced Technologies, Wiley & Sons, Bognor Regis, GB, vol. 18, No. 4, Apr. 1, 1997, pp. 227-233, XP000691535.

Zhang, et al., "Synthesis of a New Side-Chain Type Liquid Crystal Polymer Poly[dicyclohexyl vinylterephtalate]" Macromolecules, Acs, Washington, DC, U.S., vol. 32, Jan. 1, 1999, pp. 4494-4496, XP002495422, ISSN: 0024-9297.

Zhao, et al., Synthesis and Characterization of Diblock Copolymers Based on Crystallizable Poly(e-caprolactone) and Mesogen-Jacketed Liquid Crystalline Polymer Block: Polymer, Elsevier Science Publishers B.V., GB, vol. 46, No. 14, Jun. 27, 2005, pp. 5396-5405, XP004924379, ISSN: 0032-3861.

(Continued)

*Primary Examiner* — John D Freeman
(74) *Attorney, Agent, or Firm* — Benesch, Friedlander, Coplan & Aronoff LLP

(57) ABSTRACT

A class of solvent resistant, flexible copolyimide substrates having high optical transparency (>80% from 400 to 750 nm) that is retained after brief exposure to 300° C., near-zero birefringence (<0.001) and a maximum CTE of approximately 60 ppm/° C. is disclosed. The copolyimides are prepared from alicyclic dianhydrides, aromatic cardo diamines, and aromatic diamines containing free carboxyl groups. The substrates are manufactured from solutions of the copolyimides containing multifunctional epoxides in the form of single layer films, multilayer laminates and glass fiber reinforced composite films. The substrates can be used in the construction of flexible optical displays, and other microelectronic and photovoltaic devices that require their unique combination of properties.

14 Claims, No Drawings

(56) References Cited

U.S. PATENT DOCUMENTS

| | | |
|---|---|---|
| 2005/0105027 A1 | 5/2005 | Wada et al. |
| 2005/0200792 A1 | 9/2005 | Jeon et al. |
| 2005/0270458 A1 | 12/2005 | Ishikawa et al. |
| 2006/0062935 A1 | 3/2006 | Murakami |
| 2006/0106193 A1 | 5/2006 | Moriyama et al. |
| 2006/0114383 A1 | 6/2006 | Kobayashi et al. |
| 2007/0020407 A1 | 1/2007 | Umemoto et al. |
| 2007/0046870 A1 | 3/2007 | Murakami et al. |
| 2007/0177087 A1 | 8/2007 | Kawahara et al. |
| 2008/0239491 A1 | 10/2008 | Zheng et al. |
| 2008/0241565 A1 | 10/2008 | Germroth et al. |
| 2009/0068380 A1 | 3/2009 | Xiaoliang et al. |
| 2009/0221777 A1 | 9/2009 | Chiba et al. |
| 2009/0269597 A1 | 10/2009 | Bito et al. |
| 2009/0318660 A1 | 12/2009 | Bos et al. |
| 2010/0060834 A1 | 3/2010 | Fang et al. |
| 2010/0187719 A1 | 7/2010 | Oishi et al. |
| 2011/0109855 A1 | 5/2011 | Kilickiran et al. |

FOREIGN PATENT DOCUMENTS

| | | |
|---|---|---|
| JP | H05230211 A | 9/1993 |
| JP | 2004-183975 | 7/2004 |
| JP | 2006212802 A | 8/2006 |
| JP | 2006-345390 | 12/2006 |
| JP | 2007 046 059 | 2/2007 |
| JP | 2007-063417 | 3/2007 |
| JP | 2007-231224 | 9/2007 |
| JP | 2009-067834 | 4/2009 |
| JP | 2009-079210 | 4/2009 |
| JP | 2010189578 A | 9/2010 |
| JP | 2010-253850 | 11/2010 |
| JP | 2014-031718 | 2/2014 |
| WO | 2004086146 | 10/2004 |
| WO | 2008 121 584 | 10/2008 |

OTHER PUBLICATIONS

Li, et al., "Hierarchical Assembly of a Series of Rod-Coil Block Copolymers: Supramolecular LC Phase in Nanoenvironment" Macromolecules 2004, vol. 37, No. 8, pp. 2854-2860.

Luo, et al., "Conduction Mechanism in a Novel Oxadiazole Derivative: Effects of Temperature and Hydrostatic Pressure" J. Phys. D: Appl. Phys. vol. 38, 2005, pp. 1132-1135, IOP Publishing Ltd. Printed in the UK.

Ito, H.; Oka, W.; Goto, H.; Umeda, H.; Plastic Substrates for Flexible Displays, JP Journal of Applied Physics, vol. 45, No. 5B, 2006, pp. 4325-4329.

Li, F.; Harris, F.W.; Cheng, S.Z.D.; Polyimide Films As Negative Birefringent Compensators for Normally White Twisted Nematic Liquid Crystal Displays, Polymer vol. 37, No. 23, 1996, pp. 5321-5325.

Matthews, A. S.; Kim, I.; Ha, C.S.; Fully Aliphatic Polyimides From Adamantane-Based Diamines for Enhanced Thermal Stability, Solubility, Transparency, and Low Dielectric Constant, Dept. of Polymer Science and Engineering, Pusan National University, Busan, 2006, pp. 609-735, Korea.

Mehdipour-Antaei, S.; Babanzadeh, S.; New Types of Heat-Resistant, Flame-Retardant Ferrocene-Based Ployamides With Improved Solubility, Iran Polymer and Petrochemical Institute, P. O. Box 14965/115, Tehran, Iran (Available at ScienceDirect, Reactive & Functional Polymers 67, 2007, pp. 883-892.

Liou, G.S.; Hsiao, S.H.; Ishida, M.; Kakimoto, M.; Imai, Y.; Synthesis and Characterization of Novel Soluble Triphenylamine-Containing Aromatic Polyamides Based on N,N'-Bis(4-Aminophenyl)-N,N'-Diphenyl-1,4-Phenylenediamine; Journal of Polymer Science; Part A: Polymer Chemistry, vol. 40, 2002, pp. 2810-2818.

Phillips, R.E.; Soulen, R.L.; Propylene Oxide Addition to Hydrochloric Acid, Journal of Chemical Education, vol. 72, No. 7, Jul. 1995, pp. 624-625.

Seo, K.B.; Jeong, J.K.; Choi, S.J.; Hong, Y.T.; Suh, D.H.; Synthesis and Characterization of Novel Aromatic-Aliphatic Poly(Amide-Imide-Imide)s (PAII), Die Angewandte Makromolekulare Chemic 264, 1999, oo, pp. 30-38, (Mr 4590).

Ebadi, H.; Mehdipour-Ataei, S.; Heat-Resistant, Pyridine-Based Polyamides Containing Ether and Ester Units With Improved Solubility, Chinese Journal of Polymer Science, vol. 28, No. 1, 2010, pp. 29-37.

Mehdipour-Ataei, S.; Hatami, M.; Mosslemin, M.H.; Organosoluble, Thermally Stable Polyamides Containing Sulfone and Sulfide Units, Chinese Journal of Polymer Science, vol. 27, No. 6, 2009, pp. 781-787.

Chai, C.; Wang, J.; Fan, X.; Chen, X.; Zhou, Q.; Synthesis and Characterization of Mesogen Jacketed Liquid Crystalline Polymer Containing 1, 3, 4-Oxadiazole, Beijing National Laboratory for Molecular Science, Key Laboratory of Polymer Chemistry and Physics of Ministry of Education College of Chemistry and Molecular Engineering, Peking University, Beijing, 2006, 532-535.

Liu, J.M.; Lee, T.M.; Wen, C.H.; Leu, C.M.; High Performance Organic-Inorganic Hybrid Plastic Substrate for Flexible Display and Electronics, MCL, Industrial Technology Research Institute, Chutung, Hsinchu, 310 Taiwan, ROC, SID 10 Digest, pp. 913-916.

European Search Report, dated Dec. 18, 2014 Application No. 12825153.5—priority PCT/US2012/051322, pp. 1-43.

* cited by examiner

THERMALLY STABLE, LOW BIREFRINGENT COPOLYIMIDE FILMS

FIELD

This application claims priority to a provisional patent application, Ser. No. 61/525,237 filed Aug. 19, 2011, entitled Thermally Stable Low Birefringent Polyimide Film, the contents of which are herein incorporated by reference. The invention relates to the manufacture of solvent resistant, transparent copolyimide films that display near zero birefringences. More particularly, the invention relates to the manufacture and use of carboxyl-substituted copolyimides, which have a rigid backbone with a glass transition temperature (Tg) higher than 400° C., yet are still soluble in conventional organic solvents. The copolyimides are cast into films that have high optical transparency over a range of 400~750 nm (transmittance >80%) and display near zero birefringence from solutions that contain multifunctional epoxides. Solvent resistance is achieved by heating the films at approximately 250° C. or lower for approximately 30 minutes or less. The process takes place without a significant change in the film optical and thermal properties. The films are useful as flexible substrates for liquid crystal displays (LCDs), organic light emitting diodes (OLEDs) and other microelectronic and photovoltaic devices.

BACKGROUND

The next-generation of optical displays including liquid crystal displays (LCDs), organic light emitting diodes displays (OLEDs) and electrophoretic displays (EPDs) will be flexible. The glass substrates currently used in such displays are thick, heavy, rigid, and vulnerable to breaking, reducing product design freedom. Polymer substrate materials are attractive because they open new possibilities for product design and fabrication. Compared to rigid substrates like glass, polymer substrates offer some potentially significant advantages in electronic devices, including:
  (A) Light weight (glass substrates represent about 98% of the total weight in a thin film solar cell).
  (B) Flexible (Easy to handle, low transportation costs, and/or more applications for both raw materials and products.)
  (C) Amenable to roll-to-roll manufacturing, which could greatly reduce the manufacturing costs.

To facilitate these inherent advantages of a polymeric substrate for the flexible display application, several issues, however, must be addressed including:
  (A) Increasing the thermal stability;
  (B) Reducing the coefficient of thermal expansion (CTE);
  (C) Maintaining high transparency during high temperature processing;
  (D) Increasing the solvent resistance; and
  (E) Increasing the oxygen and moisture barrier properties.

Currently, no candidate substrate film can provide sufficient barrier properties. However, this is not a limiting factor as an additional barrier layer can be applied.

There are some organic polymers available that display some of the target properties that have been utilized to fabricate commercial thin, planar, light-weight displays, for example cell phone displays. Although some of these materials have also been used to fabricate rollable and conformable prototype displays, none of these devices are commercially viable due to their poor performance and production yields. The performance and durability of these displays could be greatly increased if the processing temperatures, namely the temperature at which the metal deposition step is carried out, could be increased. The conductivity and robustness of the metal layers are increased as the deposition temperature is increased. However, the processing temperatures are limited by the lack of a polymer with a high $T_g$ that displays all the targeted properties.

One of the most successful polymers that has been utilized is polyethylene naphthalate (PEN). PEN films are highly transparent and have a low CTE (<20 ppm/° C.). However, PEN films can only be processed below 200° C., and they exhibit high birefringence (>0.001). Despite these limitations, PEN substrates are offered commercially by DuPont, which reflects the market need. Poly(cycloolefin) (COP) films have also been extensively investigated because they have excellent transparency. Tgs above 300° C., and almost zero birefringence. However, the CTEs of these films are too large (>70 ppm/° C.) for display applications.

The outstanding thermal properties of polyimides make them natural candidates for substrates. Two commercial polyimide films, Kapton of Dupont Co (USA) and Upilex of Ube Co (Japan) have excellent mechanical properties and Tgs higher than 350° C., but the films are dark orange. Due to their insolubility, they must be prepared from precursor polyamic acid films, which further limits their utility. Due to their rigid rod structure, polyimide films usually have a relatively low CTE (the CTE of a Upilex film can be <10 ppm/° C.), and a very high birefringence (for a Upilex film, this value can be >0.10). Although several Japanese patents describe the preparation of transparent, thermally stable polyimide films, the film birefringence (~0.0040) is too high to meet display requirements (JP 2005-163012). Although two companies have recently commercialized colorless polyimide films, there are drawbacks to their products. Kolon Industries, Inc. offers a colorless film that can be radiation crosslinked. However, the film has not found wide acceptance because the birefringence is too high and the transmittance too low at 400 nm for display manufacturers. The Mitsubishi Gas Chemical Company offers a line of colorless polyimide films that also have not found wide acceptance due to their poor solvent resistance and their high birefringence. Thus, no solvent resistant polyimide film has been commercialized with high optical transmittance, near zero birefringence, a relatively low CTE and a high Tg.

As discussed above, the substrate for a flexible LCD or an OLED is required to have near zero birefringence, i.e., the refractive index along the direction perpendicular to the film plane ($n_z$) or along the directions parallel to the film plane ($n_x$ or $n_y$) must be identical. Conventional polyimides are composed of rigid rod-like, aromatic monomer units. During solution casting of soluble polyimides or polyamic acid precursors in the absence of stress, the polymer chains spontaneously orient in-plane, but without preferential in-plane orientation, resulting in zero in-plane birefringence, i.e., $n_x=n_y$. However, this process generates negative out-of-plane birefringence, i.e. $n_z<n_x=n_y$. In fact, polyimides prepared from linear rod-like, aromatic monomers (negative birefringent monomers) form films with a high negative birefringence. (U.S. Pat. Nos. 5,480,964, 5,580,950). This prevents such films from being used as display substrates where optical isotropy is required to avoid display distortion.

Transparent polyimide films have also been prepared by solution casting that exhibit positive out-of-plane birefringence [Bo Li, et. al, ACS Division of Polymer Chemistry, Polymer Preprints, 4 (1), 105 (2000)]. This has been accomplished through the use of substituted cardo diamines. The monomers have been polymerized with aromatic dianhydrides to give polymer backbones that spontaneously orient in-plane during the casting process. However, the repeat units which result from these monomers have high polarizability perpendicular to the polymer backbone that results in an out-of-plane refractive index ($n_z$) higher than that of the in-plane refractive indices ($n_x$ and $n_y$). The CTEs of these films are too high and their transmittance too low at 400 nm for substrate applications.

Alicyclic dianhydrides have been polymerized with non-cardo and cardo aromatic diamines to form polyimides that are soluble in organic solvents (U.S. Pat. No. 5,026,823). Processes have been developed for producing transparent films from the polymers produced from non-cardo aromatic diamines (US Pub. No. 2009/0160089, US Pub. No. 2010/0187719). However, the polymers have Tgs<350° C., and the films are not solvent resistant. The polyimides prepared from alicyclic dianhydrides and cardo dianhydrides have also been used to form alignment layers for LCDs [M. Nishikawa, et. al., App;/Phys. Lett., Vol 72(19), 2403 (1998)]. JP 2006058540 describes an acyclic polyimide coating on a polyolefin substrate that is stretched to form a birefringent compensation film. These films are not solvent resistant, and, hence not suitable for use as a flexible substrate. Furthermore, no copolyimide has been prepared from an alicyclic dianhydride that contains pendent carboxyl groups.

SUMMARY

It has been discovered that soluble, carboxyl-substituted copolyimides with Tgs >400° C. can be used in the manufacture of solvent resistant, transparent, flexible substrates with near zero birefringence. In particular, copolyimides prepared from alicyclic dianhydrides; aromatic, cardo dianhydrides; and aromatic diamines containing carboxyl groups can be used along with multifunctional epoxides in the manufacture of transparent flexible substrates (transmittance >80% at 400 nm to 750 nm; birefringence <0.001; and CTEs of approximately 60 ppm/° C. or less). The substrates can be used in the manufacture of flexible, flat panel displays The substrates are prepared as single layer, films; as multi-layer laminates comprising a copolyimide layer and a thin glass layer; and as glass fiber reinforced composite films. The films are cast from solutions of carboxyl-substituted copolyimides containing a multi-functional epoxide. The multi-layer laminates are prepared by casting a layer of the copolyimide on thin glass films and by the lamination of a preformed copolyimide film to the glass film. The solutions can also be used to impregnate a woven glass mat so as to form a glass-reinforced composite film. In all cases, the film is heated at elevated temperatures to induce reaction between the pendent carboxyl groups and the multifunctional epoxide. Surprisingly, the heating process may be carried out with minimal change in the film thermal or optical properties.

According to one embodiment of the invention, a process is provided for manufacturing a near-zero birefringent film comprising the steps of: (A) forming a mixture of two or more aromatic diamines wherein at least one of the diamines has a cardo structure and one contains one or more carboxyl groups, such that the amount of the diamine containing carboxyl groups is greater than approximately 1 mole percent and less than approximately 30 mole percent of the total diamine mixture; (B) dissolving the aromatic diamine mixture in a polar solvent; (C) adding at least one alicyclic dianhydride to the mixture; (D) heating the mixture at a temperature above 150° C. for more than 30 minutes; (E) isolating the resulting polymer by precipitation in an organic non-solvent such as an alcohol; (F) dissolving the isolated polymer in an organic solvent: (G) adding approximately 5 weight % to approximately 10 weight % of a multifunctional epoxide; (H) casting the copolyimide solution into a film with a thickness of approximately 25 microns or greater at a temperature less than approximately 200° C.; (I) heating the film at a temperature between approximately 200° C. and approximately 250° C. for less than approximately 30 minutes under nitrogen or under reduced pressure. In some cases it may be desirable to subject the film to a further heat treatment above 250° C. The heating conditions are such that the resulting substrate is resistant to most of the commonly used organic solvents, including NMP, DMAc, dimethyl sulfoxide (DMSO), etc. Alternatively, the process can be carried out without steps (E) and (F). In this case, the copolyimide is not isolated and the multifunctional epoxide is added directly to the polymerization mixture. Both processes may be carried out in a continuous fashion using a roll-to-roll film casting line. The process may also be modified so that a film approximately 5 microns thick is cast on a supporting glass substrate or the solution is applied to a woven glass web to form a glass-reinforced composite film.

According to another embodiment of the invention, a process is provided for manufacturing a near zero birefringent film comprising the steps of: A) forming a mixture of two or more aromatic diamines wherein at least one of the diamines has a cardo structure and one contains one or more carboxyl groups, such that the amount of the diamine that contains carboxyl groups is greater than approximately 1 mole percent and less than approximately 30 mole percent of the total diamine mixture; (B) dissolving the aromatic diamine mixture in a polar solvent; (C) adding at least one alicyclic dianhydride to the mixture; (D) stirring the mixture at a temperature below 100° C. for more than 30 minutes; (E) adding an imidization catalyst and an imidization dehydrating agent to the mixture; (F) adding approximately 5 weight % to approximately 10 weight % of a multifunctional epoxide; (H) casting the copolyimide solution into a film at a temperature less than approximately 200° C.; (I) heating the film at a temperature between approximately 200° C. and approximately 250° C. for less than approximately 30 minutes under nitrogen or under reduced pressure. In some cases, it may be desirable to subject the film to a further heat treatment above 250° C. This process may be carried out in a continuous fashion using a roll-to-roll film casting line. The process may also be modified so that a film approximately 5 microns thick is cast on a supporting glass substrate or the solution is applied to a woven glass web to form a glass-reinforced composite film.

According to yet another embodiment of the invention a copolyimide is produced with the general structure:

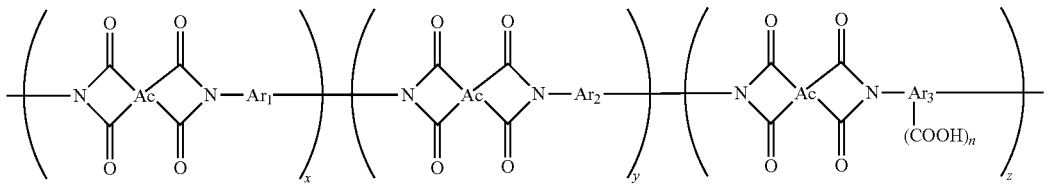

Wherein, x is 40 to 99 mol %; y is 0 to 30 mol %; and z is 1 to 30 mol % and n is 1 to 4.

Wherein, Ac is selected from the group:

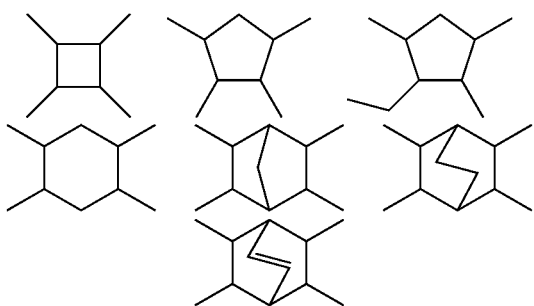

Wherein, $Ar_1$ is selected from the group:

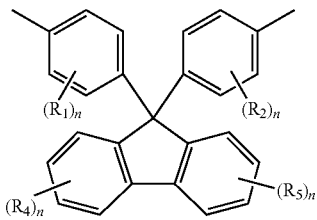

Wherein, n is 4, and wherein $R_1$, $R_2$, $R_3$, $R_4$, and $R_5$ are selected from the group comprising hydrogen, halogen (fluoride, chloride, bromide, and iodide), alkyl, substituted alkyl such as halogenated alkyls, alkoxy, substituted alkoxy such as halogenated alkoxy, aryl, substituted aryl such as halogenated aryls, ethynyl, phenylethynyl, alkyl ester, and substituted alkyl esters, and combinations thereof. It is to be understood that $R_1$, $R_2$, $R_3$, $R_4$, and $R_5$ can be the same or different.

$Ar_2$ is selected from the group of aromatic units as shown in the following general structures:

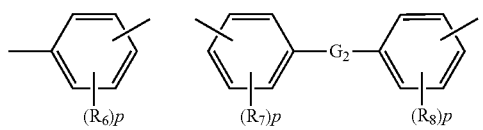

wherein, p is 4 and wherein $R_6$, $R_7$, $R_8$, are selected from the group consisting of hydrogen, halogen (fluoride, chloride, bromide and iodide), alkyl, substituted alkyl, alkoxy, aryl, or substituted aryl such as halogenated aryls, alkyl ester and substituted alkyl esters and combinations thereof;

$G_2$ is selected from a group consisting of a covalent bond, a $CH_2$ group, a $C(CH_3)_2$ group, a $C(CF_3)_2$ group, a $C(CX_3)_2$ group wherein X is a halogen; a CO group, an O atom, a S atom, a $SO_2$ group, a $Si(CH_3)_2$ group; a —$C(CH_3)_2$-aryl-$(CH_3)_2C$— group; a OZO group wherein Z is a aryl group or substituted aryl such as phenyl group, biphenyl group, perfluorobiphenyl group.

$Ar_3$ is selected from the group of aromatic units as shown in the following general structures:

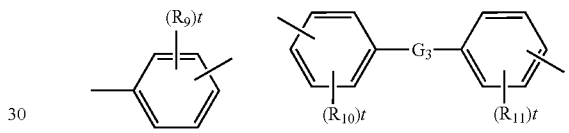

wherein t is 2 or 3, and wherein $R_9$, $R_{10}$, $R_{11}$ are selected from the group comprising hydrogen, halogen (fluoride, chloride, bromide, and iodide), alkyl, substituted alkyl such as halogenated alkyls like trifluoromethyl, alkoxy, substituted alkoxy such as a halogenated alkoxy, aryl, substituted aryl such as halogenated aryls, alkyl ester, and substituted alkyl esters, and combinations thereof. It is to be understood that each $R_9$, $R_{10}$ and each $R_{11}$ can be different or the same. $G_3$ is selected from a group comprising a covalent bond; a $CH_2$ group; a $C(CH_3)_2$ group; a $C(CF_3)_2$ group; a $C(CX_3)_2$ group, wherein X is a halogen; a CO group; an O atom; a S atom; a $SO_2$ group; a $Si(CH_3)_2$ group; and an OZO group, wherein Z is a aryl group or substituted aryl group, such as phenyl group, biphenyl group, perfluorobiphenyl group.

And, the multifunctional epoxide is selected from the group with the general structures (II), (III) and (IV):

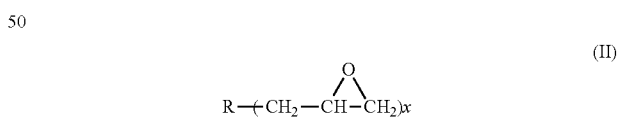

(II)

wherein x>1 and R is selected from the group (III)

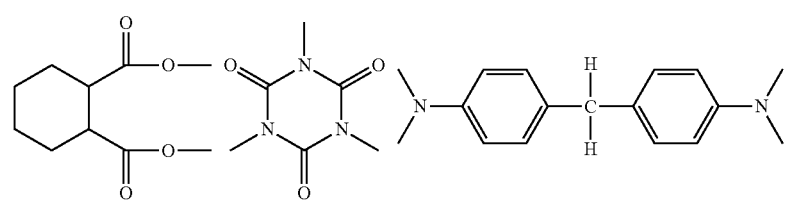

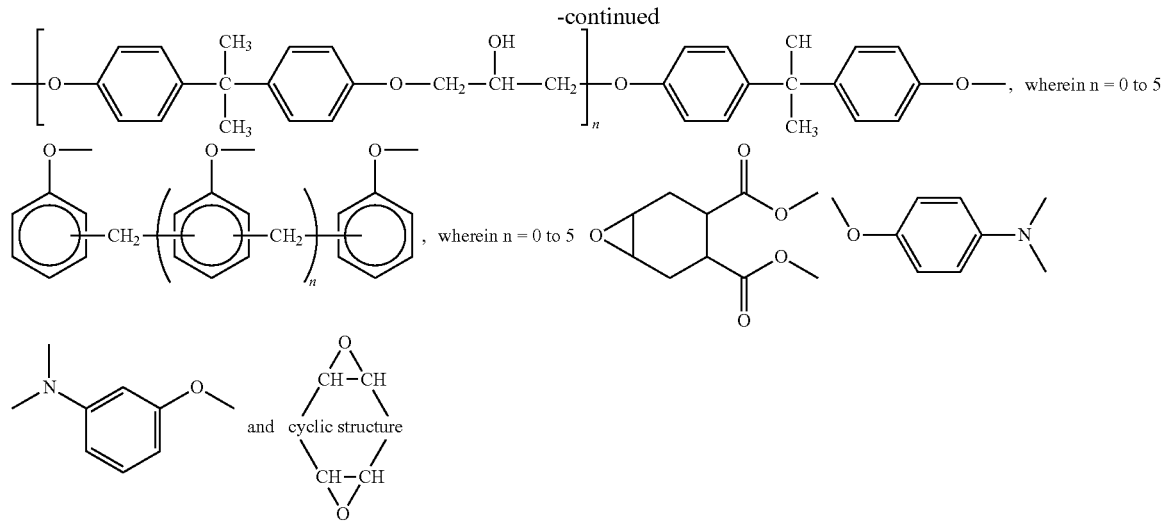

wherein the cyclic structure is selected from the group (IV)

wherein n>1 and R is an alkyl or aryl group. The substrates can serve as substrates for flexible flat panel displays, and other applications that require their unique set of properties.

DETAILED DESCRIPTION

It has been discovered that soluble copolyimides with Tgs>400° C. can be used in the manufacture of solvent resistant, transparent, flexible substrates with near zero birefringence. In particular, it has been found that copolyimides that are prepared from alicyclic dianhydrides; aromatic, cardo diamines; and aromatic diamines containing carboxyl groups can be used along with multifunctional epoxides in the manufacture of transparent substrates (transmittance >80% at 400 nm to 750 nm with a birefringence of <0.001 and a maximum CTE of approximately 60 ppm/° C. In some cases, mixtures of alicyclic dianhydrides may be used. The preferred alicyclic dianhydride is 1,2,4,5-cyclohexanetetracarboxylic dianhydride (H-PMDA). The preferred cardo diamines are 9,9'-bis(4-aminophenyl)fluorene (FDA) and its substituted derivatives. The preferred diamines containing free carboxylic acid groups are 3,5-diaminobenzoic acid (DAB) and 4,4'-diaminodiphenic acid (DADP). In some cases, it may be desirable to substitute some of the cardo diamine with a non-cardo, aromatic diamine. The monomers can be polymerized in high boiling solvents, such DMAC, NMP, and m-cresol, which can contain an imidization catalyst, such as isoquinoline, at elevated temperatures to directly yield the imidized polymer. Solvents should not be used that undergo degradation with the development of color after extended heating. The polymerization mixture may also contain reagents such as toluene and xylene that form an azeotrope with water that can be distilled from the reaction mixture. Alternatively, the monomers can be polymerized in polar aprotic solvents, such as DMAC or NMP, below 50° C. to yield a polyamic acid that is imidized either chemically or thermally. In chemical imidization a mixture of an imidization catalyst, such as a tertiary amine, and a dehydration agent, such as an aliphatic dianhydride, is added to the polymerization solution. The preferred imidization catalysts are triethylamine, pyridine, substituted pyridine derivatives, and isoquinoline. The preferred dehydration agents are acetic anhydride and perfluoroacetic anhydride. Imidization can also be carried out by a combination of these two methods. Although, the copolyimides obtained from these procedures have very high degrees of imidization, they are soluble in volatile organic solvents. In all of the polymerization procedures an excess of dianhydride is normally used so that the copolyimide is end-capped with anhydride groups. Amine end groups can degrade during the curing process leading to the development of color. A molar ratio of dianhydride to the total amount of diamines of approximately 1.001 to 1.01 is preferred.

The copolyimides are isolated by precipitation in a non-solvent, such as an alcohol. The preferred non-solvents are methanol and ethanol. A film casting solution is then prepared by dissolving the polymer and a multifunctional epoxide in a polar solvent, such as DMAC, NMP and cyclopentanone. In some cases, it may be possible to avoid the polymer isolation step and to add the multifunctional epoxide directly to the polymerization mixture. The epoxide must display minimum color. Colorless epoxides are preferred. The most preferred epoxide is triglycidyl isocyanurate (TG). The minimum amount of epoxide is used that results is a colorless film that displays solvent resistance after being heated at less than approximately 250° C. for less than approximately 30 minutes. It too little is used the film will not become solvent resistant. If an excessive amount of epoxide is used, the film will yellow when heated at elevated temperatures. The preferred amount of epoxide is approximately 2 to approximately 10 wt % of the weight of the polyamide. The most preferred amount is 4 to 6 wt %. The greater the number of epoxy groups in the multifunctional epoxide the smaller the amount that has to be used. The fact that the films become solvent resistant after heating at less than approximately 250° C. is a result of the pendent carboxyl groups located along the copolyimide backbone. If carboxyl groups are not present or too few are present, the films will not display solvent resistance. However, the amount of these groups present must be limited. An excessive amount results in a polymer that: 1) cannot be made solvent resistant even through the use of excess amounts of a multifunctional epoxides; 2) is moisture sensitive; and 3) displays too high a CTE and a reduced thermal stability. The carboxyl group content is controlled by controlling the amount of diamine that contains carboxyl groups that is used in the preparation of the polymer. The preferred amount of this diamine is 5 to 50 mol % of the diamine mixture. The most preferred amount is 10 to 20 mol %. The greater the number of carboxyl groups in the diamine, the less the amount that is required to enhance the curing process.

Surprisingly, the carboxyl group undergoes reaction with the epoxide at elevated temperatures without the development of color. It has been discovered that other functional groups that react with epoxy groups such as hydroxyl groups promote curing, but at the expense of color development. The curing process is carried out under reduced pressure or in an inert atmosphere so that no change in the film properties occurs. It is especially important that the process is carried out without any oxidative degradation that leads to the development of color.

The copolyimides are prepared from alicyclic dianhydrides selected from the group:

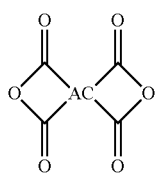

Wherein, AC is selected from the group:

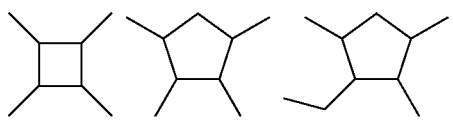

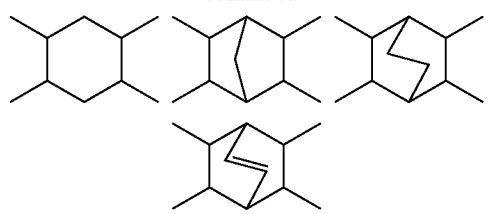

Particularly useful dianhydrides are:

1,2,3,4-Cyclobutanetetracarboxylic dianhydride (CBDA)

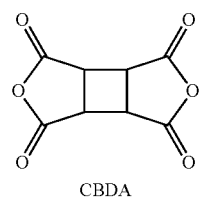 [SMILES: O=C1OC(=O)C2C1C1C(=O)OC(=O)C21]

CBDA 1,2,3,4-Cyclopentanetetracarboxylic dianhydride (CPDA)

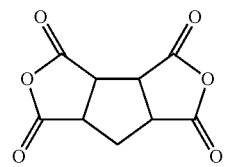 [SMILES: O=C1OC(=O)C2C1CC1C(=O)OC(=O)C12]

1,2,3,4-Cyclohexanetetracarboxylic dianhydride (H-PMDA)

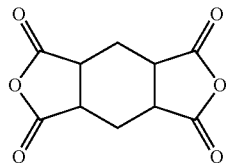 [SMILES: O=C1OC(=O)C2CC3C(=O)OC(=O)C3CC12]

Bicyclo[2.2.2]oct-7-ene-2,3,5,6-tetracarboxylic dianhydride (BODA)

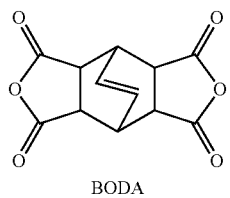

BODA

And cardo, aromatic diamines selected from the group:

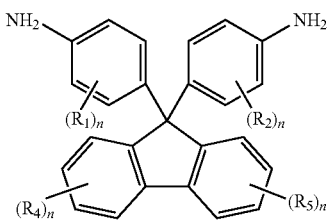

wherein, n is 4; and wherein $R_1$, $R_2$, $R_3$, $R_4$, and $R_5$ are selected from the group comprising hydrogen, halogen (fluoride, chloride, bromide, and iodide), alkyl, substituted alkyl such as halogenated alkyls, alkoxy, substituted alkoxy such as halogenated alkoxy, aryl, or substituted aryl such as halogenated aryls, ethynyl, phenylethynyl, alkyl ester and substituted alkyl esters, and combinations thereof. It is to be understood that $R_1$, $R_2$, $R_3$, $R_4$, and $R_5$ can be the same or different.

Particularly useful cardo diamines are:

9,9'-Bis(4-aminophenyl)fluorene (FDA)

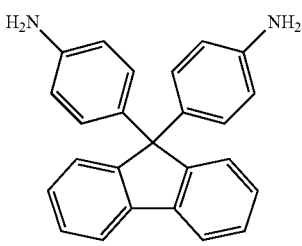 [SMILES: Nc1ccc(C2(c3ccc(N)cc3)c3ccccc3-c3ccccc32)cc1]

9,9'-Bis(4-amino-3-fluorophenyl)fluorene (FFDA)

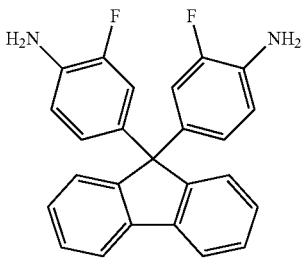 [SMILES: Nc1ccc(C2(c3ccc(N)c(F)c3)c3ccccc3-c3ccccc32)cc1F]

9,9'-Bis(4-amino-3-ethylphenyl)fluorene (MeFDA)

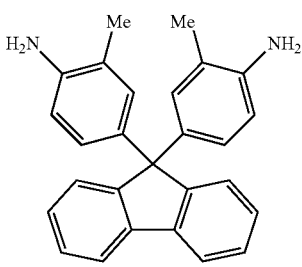 [SMILES: Cc1cc(C2(c3ccc(N)c(C)c3)c3ccccc3-c3ccccc32)ccc1N]

And aromatic diamines selected from the group:

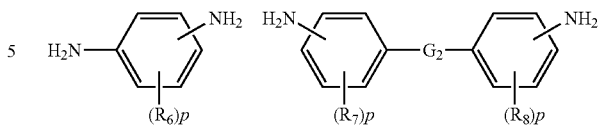

wherein p is 4, and wherein $R_6$, $R_7$ and $R_8$ are selected from the group comprising hydrogen, halogen (fluoride, chloride, bromide, and iodide), alkyl, substituted alkyl such as halogenated alkyls, alkoxy, substituted alkoxy such as a halogenated alkoxy, aryl, substituted aryl such as halogenated aryls, alkyl ester, and substituted alkyl esters, and combinations thereof. It is to be understood that $R_6$, $R_7$, and $R_8$ can be the same or different; and wherein $G_2$ is selected from a group comprising a covalent bond; a $CH_2$ group; a $C(CH_3)_2$ group; a $C(CX_3)_2$ group, wherein X is a halogen; a CO group; an O atom; a S atom; a $SO_2$ group; a $Si(CH_3)_2$ group, a —$C(CH_3)_2$-aryl-$(CH_3)_2C$—; and an OZO group, wherein Z is an aryl group or substituted aryl group, such as a phenyl group, a biphenyl group, and a perfluorobiphenyl group.

And aromatic diamines containing a pendent carboxyl group selected from the group:

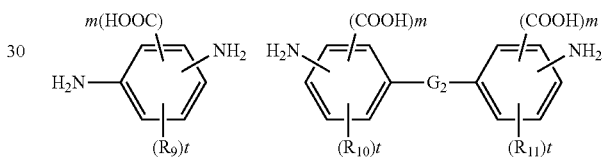

wherein, m is 1 to 2, wherein t is 1 to 4, and wherein $R_9$, $R_{10}$, $R_{11}$ are selected from the group comprising hydrogen, halogens (fluoride, chloride, bromide, and iodide); alkyl groups; substituted alkyl groups such as halogenated alkyl groups; alkoxy groups; substituted alkoxy groups such as halogenated alkoxy groups; aryl groups; substituted aryl groups such as halogenated aryls; alkyl ester groups; and substituted alkyl ester groups; and combinations thereof. It is to be understood that $R_9$, $R_{10}$, and $R_{11}$ can be the same or different. $G_1$ is selected from a group comprising a covalent bond; a $CH_2$ group; a $C(CH_3)_2$ group; a $C(CX_3)_2$ group, wherein X is a halogen; a CO group; an O atom; a S atom; a $SO_2$ group; a $Si(CH_3)_2$ group; and an OZO group, wherein Z is a aryl group or substituted aryl group, such as a phenyl group; a biphenyl group, and a perfluorobiphenyl group.

Representative and illustrative examples of the useful aromatic diamines with pendant free carboxylic acid groups are:

4,4'-Diaminodiphenic acid (DADP);

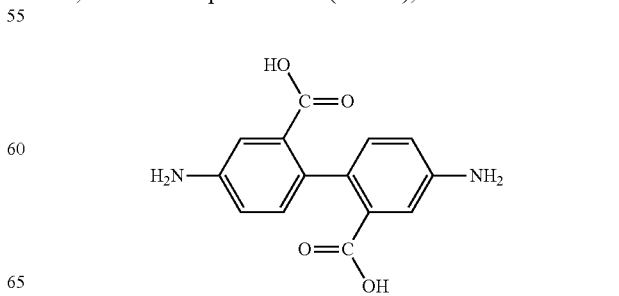

3,5-Diaminobenzoic acid (DAB).
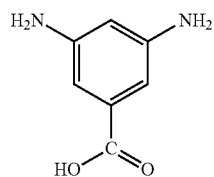 [SMILES: Nc1cc(N)cc(C(=O)O)c1]
And, the multifunctional epoxide is selected from the group with the general structures (II), (III) and (IV):
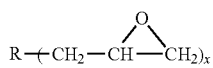 (II)
wherein x>1 and R is selected from the group
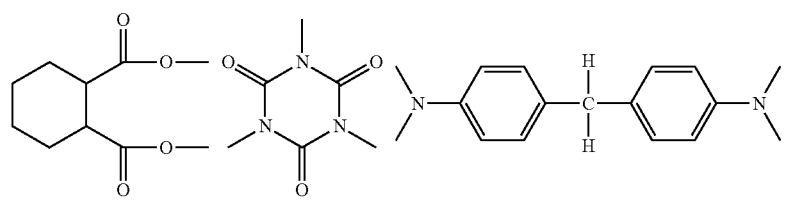
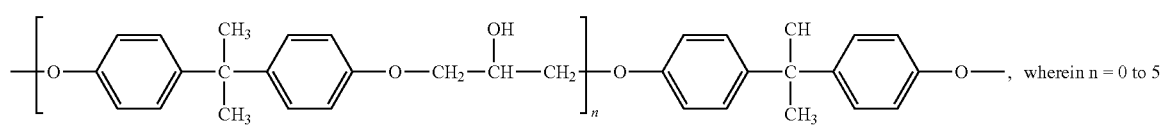, wherein n = 0 to 5
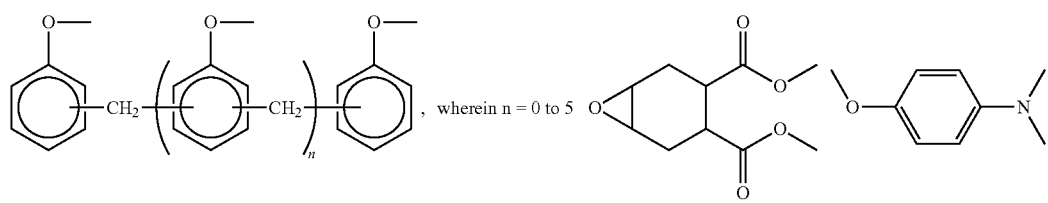, wherein n = 0 to 5
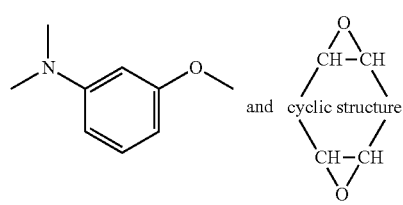
and cyclic structure
wherein the cyclic structure is selected from the group
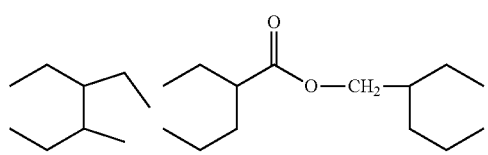 (IV)
-continued
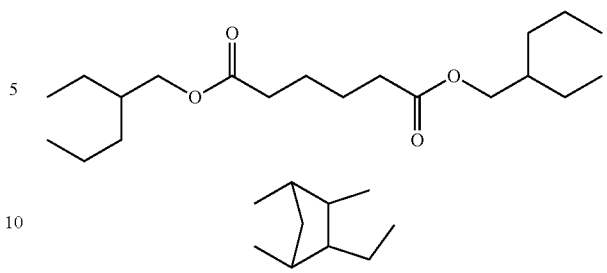
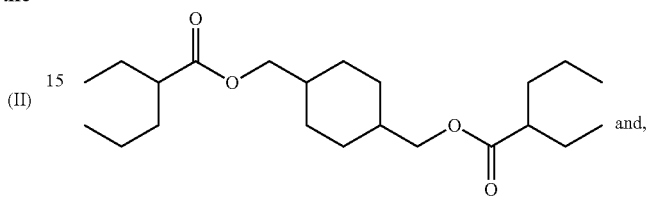 and,
(III)
-continued
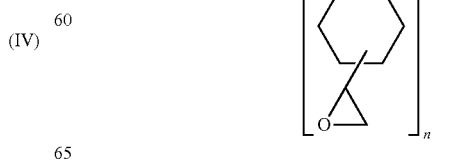
wherein n>1 and R is an alkyl or aryl group.

Representative and illustrative examples of multifunctional compounds containing epoxy groups particularly useful are:
Diglycidyl 1,2-cyclohexanedicarboxylate (DG)
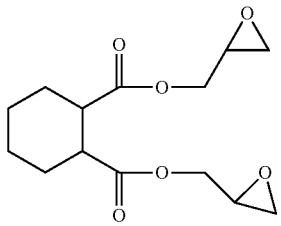 [SMILES: O=C(OCC1CO1)C1CCCCC1C(=O)OCC1CO1]
Triglycidyl isocyanurate (TG)
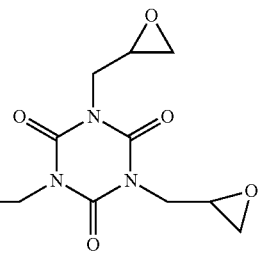
Tetraglycidyl 4,4'-diaminophenyl methane (TTG)
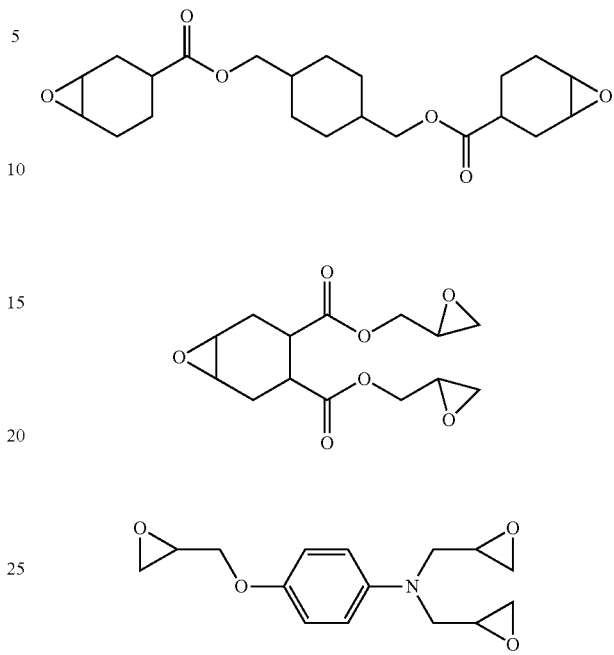
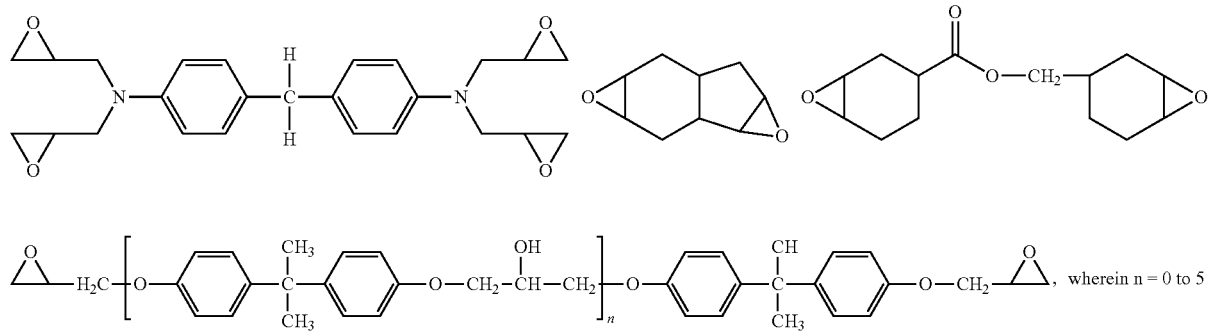
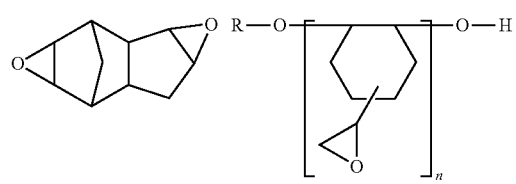
wherein n>1 and R is an alkyl or aryl group -continued

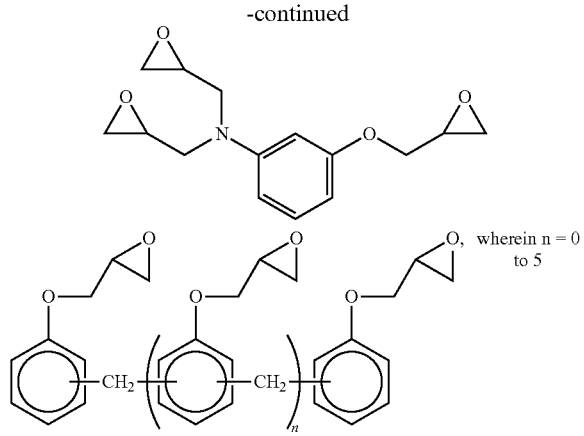

wherein n = 0 to 5

Substrates can be prepared as single layer, films; as multi-layer laminates comprising a copolyimide layer and a thin glass layer; and as glass-reinforced composite films. The single layer films can be prepared by solution casting techniques known to those skilled in the art from solutions of the copolyimides containing multifunctional epoxides. Both batch and continuous processes, such as a roll-to-roll process, may be used. The viscosity of the solution is adjusted by adjusting the solids concentration and the polymer molecular weight so that optimum films may be produced with the equipment used. Solution viscosities of 10 to 1000 poises are preferred, but not always required depending on the casting equipment. The multilayer laminates can be prepared in one step by solution casting a layer of the copolyimide/multifunctional epoxide composition on thin glass films. Additives may be used to increase the adhesion of the copolyimide to the glass. The laminates may also be prepared in a multistep process, wherein a copolyimide layer is first solution cast on a carrying tape such as a polyester film. The combination is then laminated to the glass film so that the copolyimide layer adheres to the glass. The carrying tape is removed prior to or during the construction of the flat panel display. In the preparation of glass-reinforced composite films the solutions containing the copolyimide and the multifunctional epoxide are applied to a woven glass mat. It should be understood that is all of these processes the formation of the film is accomplished by the removal of solvent at elevated temperatures. In most cases, the film is formed at temperatures less than approximately 200° C. The formed film is then heated at approximately 200° C. to approximately 250° C. for less than approximately 30 minutes. When this process is carried out in a continuous fashion where the solution is cast on an endless belt the passes through heated zones, the heating steps may not be distinguishable.

The substrates can also be prepared by solution casting techniques from solutions of copolyimide precursors, i.e. polyamic acids. In this case, the conversion of the polyamic acid to the copolyimide is carried out chemically, thermally or combinations of both during or subsequent to the casting process. A continuous, roll-to-roll process whereby the polyamic acid is mixed with a chemical imidization mixture immediately prior to casting on an endless belt, which passes through heated zones, can be used to prepare single layer substrates, copolyimide film/glass laminates, and glass reinforced copolyimide composite films. The multifunctional epoxide can be added before or subsequent to the addition of the imidization mixture. Alternatively, the process can be carried out without the addition of an imidization mixture, so that only thermal imidization occurs as the belt passes through the heated zones.

In order to simplify the construction of a flexible display, other functional and non-functional layers may be cast on or laminated to the substrate. For example, a gas barrier layer may be adhered.

EXAMPLES

Film solvent resistance. The solvent resistance of the film was determined by immersing it in a selected solvent for 30 minutes at room temperature. The film was considered insoluble and solvent resistant if it were substantially free of surface wrinkles, swelling, or any other visible damage after immersion.

Film thermal properties. The film thermal properties were determined using a TA Instruments Q400 Thermal Mechanical Analyzer. The reported CTEs are the average CTE between 30 and 300° C.

Film birefringence. The dry polymer was dissolved in an organic solvent with a solids content between 10~15%. After filtration, the solution was cast on a glass substrate using a doctor blade. The resulting film was dried at 100° C. under reduced pressure. The polymer film was removed from the glass by dipping the substrate glass in water. Films ranging from approximately 10 μm to >25 μm thick were prepared in this manner. Birefringence was determined using a 10 μm thick freestanding film with a Metricon Prism Coupler 2010/M. The birefringence is reported as $\Delta n = n_z - n_{x,y}$.

Film transparency. Transparency was measured by determining the transmittance of a 10 μm thick film from 400 to 750 nm with a UV-Visible spectrometer (Shimadzu UV 2450). The transmittance was determined before and after the film was heated at a given temperature and a given period of time under reduced pressure. The transmittance is reported as the minimum transmittance at 400 nm.

Example 1

This example illustrates the procedure to prepare a copolyimide with pendent carboxyl groups.

To a 250 ml, three necked round bottom flask equipped with a mechanical stirrer, a nitrogen inlet and an outlet connected to a gas bubbler were added 1,2,4,5,-cyclohexanedicarboxylic dianhydride (H-PMDA) (4.5286 g 20.2 mmol), 9,9'-bis(4-aminophenyl)fluorene (FDA) (5.5750 g, 16.0 mmol), 3,5-diaminobenzoic acid (DAB) (0.6086 g, 4.0 mmol) and m-cresol (50 ml). (Mol ratio H-PMDA/FDA/DAB=1.01/0.80/0.20). The mixture was heated briefly at 120° C. until the solids dissolved. The mixture was stirred at room temperature for 5 hours, and then heated at 210° C. overnight. Upon cooling, the polymer solution was poured into methanol, and the polymer precipitate that formed was collected by filtration, extracted with methanol several times, and dried under reduced pressure at 200° C. for 24 hours.

Example 2

This example illustrates the procedure to prepare copolyimide films containing a multifunctional epoxide.

The polymer was prepared according to the procedure described in Example 1. The dried polymer was mixed with TG (weight ratio of 95/5) in DMAC so as to form a solution containing 10% solids. The solution was cast on a glass plate using a doctor blade at room temperature. The film was dried at 100° C. under reduced pressure for 12 hours. The films were made solvent resistant by heating at the specified temperatures for the specified times under reduced pressure (Table 1).

Copolymers were prepared by the procedure described for Example 1 from mixtures of H-PMDA, BODA, FDA, FFDA MeFDA, DAB and DADP containing different mol ratios of the components (Tables 1-5). The components and amounts used were selected so that the resulting copolyimide had a Tg>400° C. The copolymers were mixed with different amounts of TG (wt %) in DMAC. The solutions were cast into films that were heated at specified temperatures for specified periods of time under reduced pressure. After heating, samples of the films were immersed in NMP for 30 minutes at room temperature. The effect of the solvent on the films is shown in Table 1.

TABLE 1

NMP Resistance of Copolyimide Films After Heating at 250° C.

| Polymer Films (Mol ratios of components) | Cure Time (Min) | 5 wt % TG Dispersed in Copolyimide Film | 10 wt % TG Dispersed in Copolyimide Film |
|---|---|---|---|
| H-PMDA/FDA/DAB (1.01/0.95/0.05) | 30 | Soluble | Soluble |
| H-PMDA/FDA/DAB (1.01/0.90/0.10) | 30 | Swollen | Swollen |
| H-PMDA/FDA/DAB (1.01/0.85/0.15) | 30 | Swollen | Swollen |
| H-PMDA/FDA/DAB (1.01/0.80/0.20) | 10 | Insoluble | Insoluble |
| H-PMDA/FFDA/DADP (1.01/0.90/0.10) | 10 | Insoluble | Insoluble |
| BODA/FDA/DAB (1.01/0.80/0.20) | 10 | Insoluble | Insoluble |
| BODA/FFDA/DAB (1.01/0.80/0.20) | 10 | Insoluble | Insoluble |
| BODA/MeFDA/DAB (1.01/0.80/0.20) | 10 | Insoluble | Insoluble |
| BODA/FFDA/DADP (1.01/0.90/0.10) | 10 | Insoluble | Insoluble |

TABLE 2

Optical Properties of Copolyimide Films Before and After Heat Treatment

| Polymer Films (Mol ratios of components) | Amount TG Added | Initial Δn | Initial T % at 400 nm | After Heating at 250° C. for 10 Min Δn | After Heating at 250° C. for 10 Min T % at 400 nm |
|---|---|---|---|---|---|
| H-PMDA/FDA/DAB 1.01/0.80/0.20 | 5% | 0.0008 | 88 | −0.0004 | 85 |
| | 10% | −0.0002 | 87 | 0.0002 | 85 |
| H-PMDA/FFDA/DADP 1.01/0.90/0.10 | 5% | −0.0002 | 83 | 0.0000 | 80 |
| BODA/FDA/DAB 1.01/0.80/0.20 | 5% | −0.0002 | 86 | 0.0001 | 84 |
| BODA/FFDA/DAB 1.01/0.80/0.20 | 5% | 0.0003 | 88 | −0.0001 | 85 |

TABLE 3

Thermal Properties of a Copolyimide After Heating at 250° C. for 10 Minutes

| Polymer Films (Mol ratios of components) | Amount TG Added | Tg, ° C. | CTE, ppm/° C. |
|---|---|---|---|
| H-PMDA/FDA/DAB 1.00/0.80/0.20 | 0% | 425 | 50 |
| | 10% | 440 | 49 |

TABLE 4

Optical Properties of a Copolyimide Film After Heating at Elevated Temperature

| Polymer Films (Mol ratios of components) | Amount TG Added | Transmittance, % After heating at 250° C. for 10 Minutes | Transmittance, % After heating at 300° C. for 10 Minutes |
|---|---|---|---|
| H-PMDA/FDA/DAB 1.01/0.80/0.20 | 5% | 85 | 84 |
| | 10% | 85 | 83 |

TABLE 5

Tg and CTE of Uncured Copolyimides

| Polymer Films (Mol ratios of components) | Tg, ° C. | CTE, ppm/° C. |
|---|---|---|
| H-PMDA/FDA/DADP 1.01/0.90/0.10 | 441 | 48 |
| H-PMDA/FFDA/DADP 1.01/0.90/0.10 | 423 | 61 |
| BODA/FDA/DADP 1.01/0.90/0.10 | 445 | 52 |
| BODA/FFDA/DADP 1.01/0.90/0.10 | 449 | 55 |
| BODA/MeFDA/DADP 1.01/0.90/0.10 | 439 | 58 |

COMPARATIVE EXAMPLES

Comparative Example 1

The copolyimide prepared in Example 1 was cast into film from a 10 wt % DMAC solution that did not contain a multifunctional epoxide. The film was heated at 250° C. for 30 minutes under reduced pressure. The film dissolved when immersed in NMP at room temperature.

The embodiments have been described, hereinabove. It will be apparent to those skilled in the art that the above methods and apparatus may incorporate changes and modifications without departing from the general scope of this invention. It is intended to include all such modifications and alterations insofar as they come within the scope of the appended claims or the equivalents thereof. Although the description above contains much specificity, this should not be construed as limiting the scope of the invention, but as merely providing illustrations of some of the embodiments of this invention. Various other embodiments and ramifications are possible within its scope.

Furthermore, notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

We claim:

1. A transparent, flexible film for use as a substrate in an optical display comprising:

a copolyimide; and, a multifunctional epoxide, wherein the copolyimide is prepared from a mixture of dianhydrides and diamines, wherein at least one of the dianhydrides is an alicyclic dianhydride, at least one of the diamines is an aromatic cardo diamine, and at least one of the diamines is an aromatic diamine containing a free carboxylic acid group, and wherein the diamine containing the free carboxylic acid group is present in amounts greater than 10 mole percent and less than 20 mole percent of the total diamine mixture, and wherein the film has a birefringence of <0.001 and, upon exposure to a temperature of approximately 250° C. under reduced pressure for approximately 30 minutes, is solvent resistant when the film is immersed in organic solvents, wherein the copolyimide has the general structure:

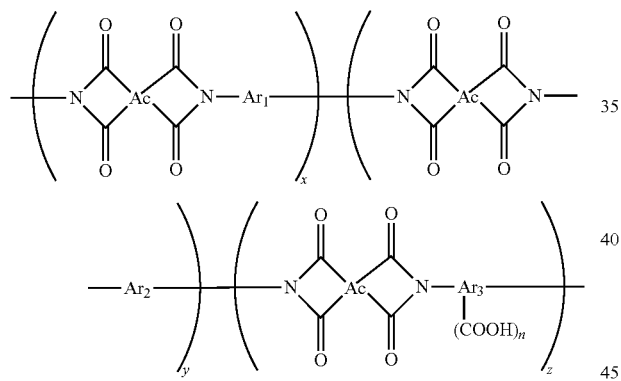

wherein, x is 50 to 90 mol %; y is 0 to 30 mol %; z is 10 to 20 mol %; and n is 1 to 3;

wherein AC is selected from the group consisting of:

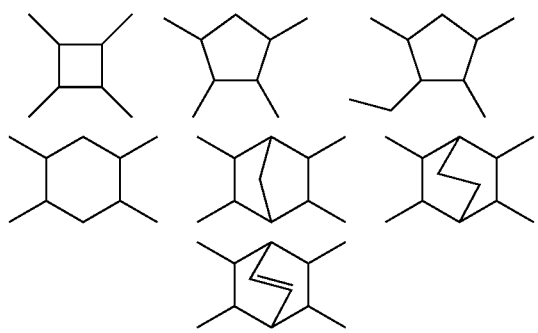

wherein $Ar_1$ is selected from the group consisting of:

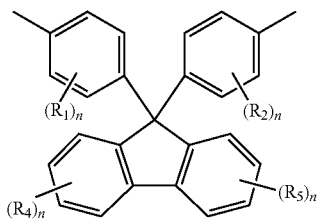

wherein, n is 4, wherein $R_1$, $R_2$, $R_4$, and $R_5$ are selected from the group consisting of hydrogen, halogen, alkyl, substituted alkyl, alkoxy, substituted alkoxy, aryl, substituted aryl, ethynyl, phenylethynyl, alkyl ester, substituted alkyl esters, and combinations thereof, wherein $R_1$, $R_2$, $R_4$, and $R_5$ can be the same or different;

wherein $Ar_2$ is selected from the group consisting of:

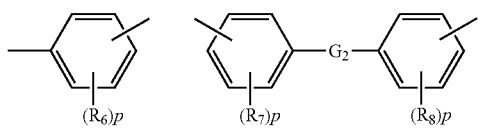

wherein p is 4, and wherein $R_6$, $R_7$, and $R_8$, are selected from the group consisting of hydrogen, halogen, alkyl, substituted alkyl, nitro, cyano, thioalkyl, alkoxy, aryl, substituted aryl, alkyl ester, substituted alkyl esters, and combinations thereof, wherein $R_6$, $R_7$, and $R_8$ can be the same or different;

wherein $G_2$ is selected from the group consisting of a covalent bond, a $CH_2$ group, a $C(CH_3)_2$ group, a $C(CF_3)_2$ group, a $C(CX_3)_2$ group wherein X is a halogen, a CO group, an O atom, a S atom, a $SO_2$ group, a Si $(CH_3)_2$ group, a —$C(CH_3)_2$-aryl-$(CH_3)_2C$— group, and a OZO group wherein Z is a aryl group or a substituted aryl group;

wherein $Ar_3$ selected from the group consisting of:

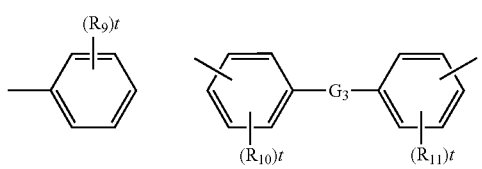

wherein t=1 to 3, wherein $R_9$, $R_{10}$, and $R_{11}$ are selected from the group consisting of hydrogen, halogen, alkyl, substituted alkyl, alkoxy, substituted alkoxy, aryl, substituted aryl, alkyl ester, substituted alkyl esters, and combinations thereof, wherein $R_9$, $R_{10}$, and $R_{11}$ can be the same or different;

wherein $G_3$ is selected from the group consisting of a covalent bond; a $CH_2$ group; a $C(CH_3)_2$ group; a $C(CF_3)_2$ group; a $C(CX_3)_2$ group, wherein X is a halogen; a CO group; an O atom; a S atom; a $SO_2$ group; a $Si(CH_3)_2$ group; and an OZO group, wherein Z is an aryl group or a substituted aryl group.

2. The film of claim 1, wherein the amount of multifunctional epoxide is 2 to 10 wt % based on the weight of the copolyimide.

3. The film of claim 1, wherein the transmittance from 400 to 750 nm is >80%, and the maximum CTE is approximately 60 ppm/° C.

4. The film of claim 1, wherein the alicyclic dianhydride is selected from the group consisting of 1,2,3,4 cyclobutanetetracarboxylic dianhydride, 1,2,3,4-cyclopentanetetracarboxylic dianhydride, 1,2,4,5-cyclohexanetetracarboxylic dianhydride, and bicyclo[2.2.2]oct-7-ene-2,3,5,6-tetracarboxylic dianhydride.

5. The film of claim 1, wherein the aromatic cardo diamine is selected from the group consisting of 9, 9-bis(4-aminophenyl)fluorene, 9, 9-bis(4-amino-3-fluorophenyl)fluorene, and 9, 9-bis(4-amino-3-methylphenyl)fluorene.

6. The film of claim 1, wherein the mixture of aromatic diamines contains a non-cardo aromatic diamine.

7. The film of claim 1, wherein the aromatic diamine containing a free carboxylic acid group is selected from the group consisting of 3,5-daminobenzoic acid and 4,4'-diaminodiphenic acid.

8. The film of claim 1, wherein the multifunctional epoxide is selected from the group consisting of structures (II), (III) and (IV):

(II)

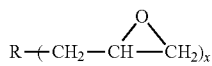

wherein x>1 and R is selected from the group consisting of:

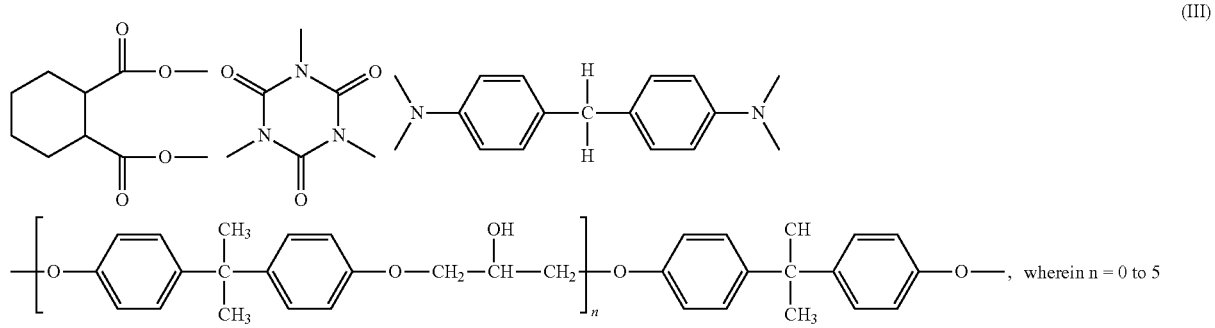

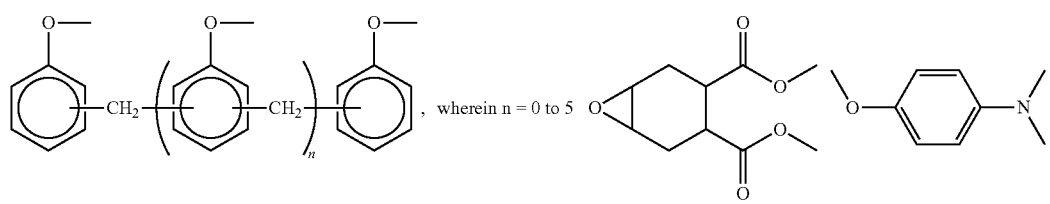

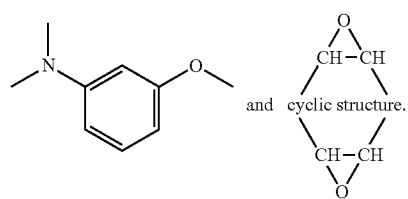

wherein the cyclic structure is selected from the group consisting of:

(IV)

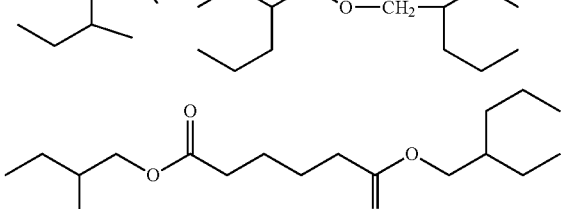

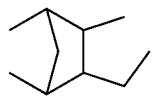

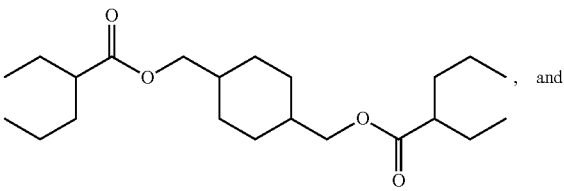
, and (III)

-continued

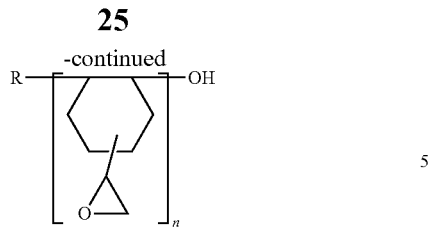

wherein n>1 and R is an alkyl or aryl group.

9. The film of claim 8, wherein the multifunctional epoxide is selected from the group consisting of diglycidyl 1,2-cyclohexanedicarboxylate, triglycidyl isocyanurate, tetraglycidyl 4,4'-diaminophenylmethane, 2,2-bis(4-glycidyloxylphenyl)propane, 7H-indeo[1,2-b:5,6-b]bisoxireneoctahydro, and epoxycyclohexylmethyl 3,4-epoxycyclohexanecarboxylate.

10. A transparent, flexible substrate comprising a free standing film of claim 1 that is at least approximately 25 microns thick.

11. A multilayer, transparent, flexible substrate comprising a layer prepared from the film of claim 1 and a glass layer.

12. The substrate of claim 11, wherein the film is at least approximately 5 microns thick and the glass layer is at least approximately 25 microns thick.

13. The substrate of claim 11, wherein the transmittance from 400 to 750 nm is >80% and the maximum CTE is approximately 60 ppm/° C.

14. A glass fiber reinforced, transparent, flexible copolyimide substrate comprising the film of claim 1 and a glass mat.

* * * * *